United States Patent [19]
Chang et al.

[11] Patent Number: 5,512,506
[45] Date of Patent: Apr. 30, 1996

[54] LIGHTLY DOPED DRAIN PROFILE OPTIMIZATION WITH HIGH ENERGY IMPLANTS

[75] Inventors: Kuang-Yeh Chang, Los Gatos, Calif.; Mark I. Gardner, Ceder Creek; Frederick N. Hause, Austin, both of Tex.

[73] Assignee: Advanced Micro Devices, Inc., Sunnyvale, Calif.

[21] Appl. No.: 417,568

[22] Filed: Apr. 6, 1995

[51] Int. Cl.$^6$ ............................................. H01L 21/266
[52] U.S. Cl. ........................ 437/44; 437/931; 437/979
[58] Field of Search ........................... 437/41 R, 41 L, 437/41 D, 44, 931, 978, 979; 148/DIG. 163

[56] References Cited

U.S. PATENT DOCUMENTS

| | | | |
|---|---|---|---|
| 4,908,326 | 3/1990 | Ma et al. | 437/44 |
| 5,221,632 | 6/1993 | Kurimoto et al. | 437/44 |
| 5,428,240 | 6/1995 | Lur | 437/931 |

Primary Examiner—Chandra Chaudhari
Attorney, Agent, or Firm—Skjerven, Morrill, MacPherson, Franklin & Friel; Paul J. Winters

[57] ABSTRACT

After growth of a thin oxide on a silicon semiconductor body, and formation of a gate thereover, a blanket layer of oxide is deposited over the resulting structure, this oxide layer having, as measured from the surface of the silicon body, relatively thick regions adjacent the sides of the gate and relatively thin regions extending therefrom. Upon implant of ions, the relatively thick regions block ions from passing therethrough into the semiconductor body, while the relatively thin regions allow passage of ions therethrough into the body. After drivein of the ions, the thick layer of oxide is isotopically etched to take a substantially uniform layer therefrom over the entire surface of the thick oxide layer, so that the thick regions thereof are reduced in width. Upon a subsequent ion implant step, the thick regions, now reduced in width from the sides of the gate, block passage of ions therethrough, while the thin regions allow ions therethrough into the silicon body. This process may be continued as chosen to from a desired source and drain profile.

7 Claims, 4 Drawing Sheets

LIGHTLY DOPED DRAIN PROFILE OPTIMIZATION WITH HIGH ENERGY IMPLANTS

FIELD OF THE INVENTION

This invention relates to MOS technology, and more particularly, to MOS technology devices which employ lightly doped drain (LDD) structures.

BACKGROUND OF THE INVENTION

Hot-carrier effects are known to cause serious performance degradation in short-channel MOS devices which use conventional drain structures. To remedy this problem, alternative drain structures such as lightly doped drain (LDD) structures have been developed.

FIGS. 1 through 4 illustrate a typical prior art method for fabricating a transistor using an LDD.

As shown therein, a P type substrate 10 is initially provided, and a thin gate oxide 12 is grown thereover. A polysilicon gate 14 is formed over the thin gate oxide 12 by photoresist and etching steps as is well known. An N– implant is undertaken through the thin gate oxide on either side of the gate 14, and the implanted ions are driven in to form lightly doped regions 16 and 18, which are self-aligned with the edges of the gate 14.

A layer of oxide 20 (FIG. 2) is deposited over the resulting structure. The oxide 20 is anisotropically etched to form spacers 22, 24 on the sides of polysilicon gate 14 (FIG. 3). An anisotropic dry etching process is typically used to form spacers 22, 24 since wet etching processes are usually isotropic and generally unable to construct spacers having a suitable form.

As also shown in FIG. 3, N+ ions are implanted and driven in (FIG. 4) to form heavily doped regions 26, 28 which are self aligned with the edges of the spacers 22, 24.

The form of the LDD region 18A, which determines the hot carrier performance of the device, is established by the spacer profile. The spacer profile varies as a function of the oxide 20 etch time and the oxide 20 thickness. A particular amount of over-etch is necessary to form the spacers 22, 24, however, excessive over-etching reduces the width and height of the spacers 22, 24 and causes gouging into the silicon 10 by etching through the thin oxide 12 on the sides of the gate 14 and exposing the silicon 10 to the etchant. Control of this over-etch process becomes more difficult as the deposited oxide layer 20 thickness increases.

Additionally, the use of such a process results in a lightly doped drain region 18A having a form determined by the spacer profile. It may well be advantageous to provide a more refined spacer profile to enhance performance of the device, with it also being understood that the process for achieving this should be simple and effective.

SUMMARY OF THE INVENTION

In accordance with the present invention, after growth of a thin oxide on a silicon semiconductor body, and formation of a gate thereover, a blanket layer of oxide is deposited over the resulting structure, this deposited oxide layer having, as measured from the surface of the silicon body, relatively thick regions adjacent the sides of the gate and relatively thin regions extending therefrom on either side of the gate. Upon implant of ions, the relatively thick regions of deposited oxide block ions from passing therethrough into the semiconductor body, while the relatively thin regions of deposited oxide allow passage of ions therethrough. After drivein of the implanted ions, the regions formed in the silicon are aligned to the thick portions. The deposited oxide layer is then isotopically etched to remove a substantially uniform layer therefrom over the entire surface of the deposited oxide layer. Upon a subsequent ion implant step, the thick regions, which are now reduced in width from the sides of the gate, block passage of ions therethrough, while the thin regions allow ions therethrough into the silicon, so that after drivein of the implanted ions, the regions formed in the silicon are self aligned to the edges of the less-wide thick oxide regions. This process may be repeated as chosen to from source and drain profiles as chosen.

DESCRIPTION OF THE PREFERRED EMBODIMENT

Figure 1:
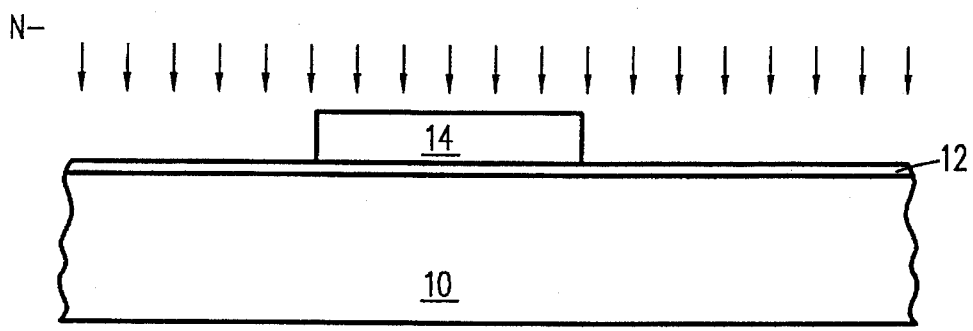
FIGS. 1–4 show cross-sectional views of the formation of a semiconductor device in accordance with the prior art.
Figure 2:
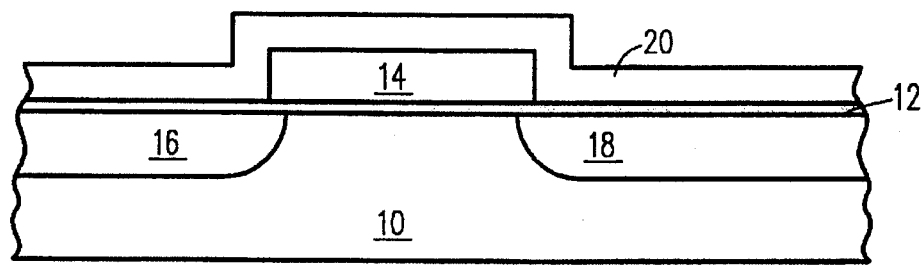
Figure 3:
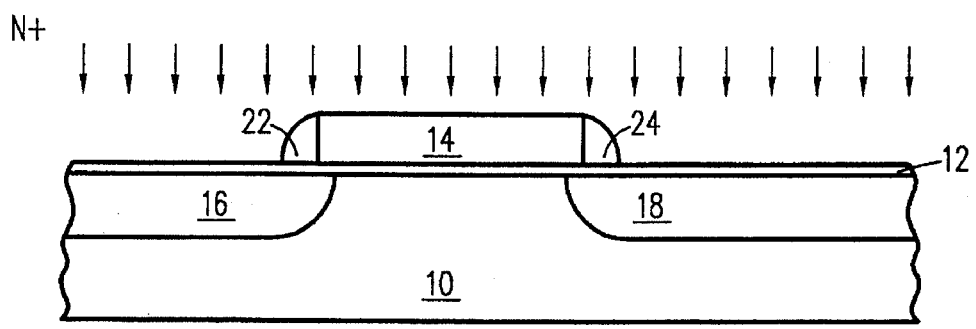
Figure 4:
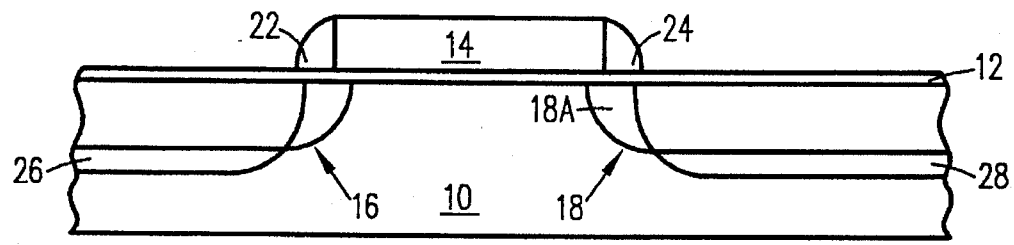
Figure 5:
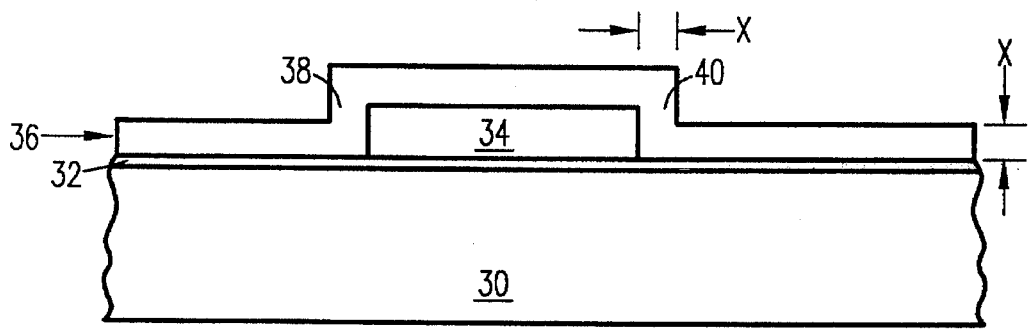
FIGS. 5–11 show cross-sectional views of the formation of a semiconductor device in accordance with the present invention.

With reference to FIG. 5, a semiconductor body, in this particular embodiment P type silicon, is shown at 30. A thin layer of gate oxide 32 is thermally grown on the semiconductor body 30, and a polysilicon gate 34 is formed thereover, as previously described.

A conformal layer of oxide 36 having a substantially uniform thickness in the range of 500 Å–2000 Å is then deposited over the resulting structure, i.e., over the top of the gate 34 and along the sides thereof, and over the exposed portions of the thin oxide 32. The deposited oxide layer 36, as is well known, has relatively thick regions 38, 40, as measured from the surface of the semiconductor body 30, on either side of the gate 34, and relatively thin regions 42, 44 over the thin oxide 32 and spaced from the sides of the gate 34. Since the oxide 36 is conformal, the relatively thick region 40, for example, has a general width X, as measured from the edge of the gate 34, equivalent to the thickness of the oxide layer deposited. It is to be understood that the concept of the thick region having a general width is important in determining, as will be further described, that ions in a forthcoming ion implant step pass through the relatively thin regions 42, 44 of the deposited oxide layer 36 but are blocked by the thick oxide regions 38, 40 from reaching the semiconductor body.

Figure 6:
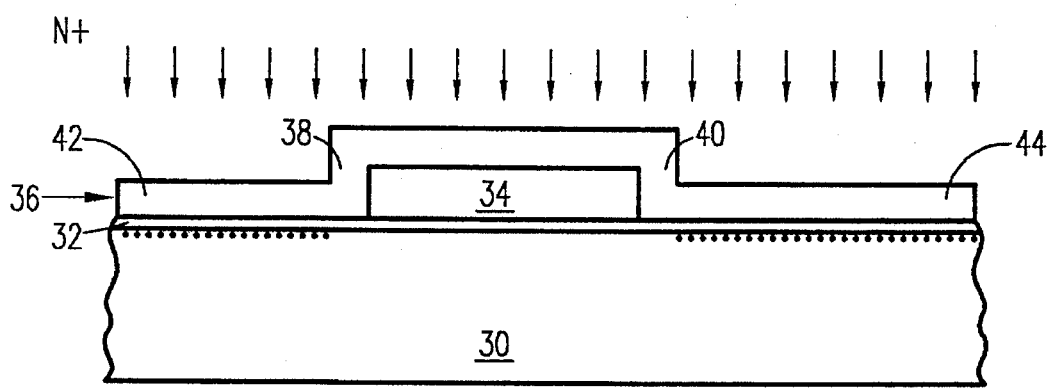

An ion implant step (shown as N+, but it will be understood that all conductivities shown and described can be reversed), is undertaken (FIG. 6). The following are examples of implant steps.

| | ion dose | N+ implant Arsenic $1-5 \times 10^{15}$ | P+ implant $BF_2$ $1-5 \times 10^{15}$ |
|---|---|---|---|
| energy relative to deposited oxide thickness | 500Å | 100 Kev–200 Kev | 60 Kev–120 Kev |
| | 1000Å | 200 Kev–300 Kev | 120 Kev–180 Kev |
| | 1500Å | 300 Kev–400 Kev | 180 Kev–300 Kev |
| | 2000Å | 400 Kev–500 Kev | 300 Kev–360 Kev |

Figure 7:
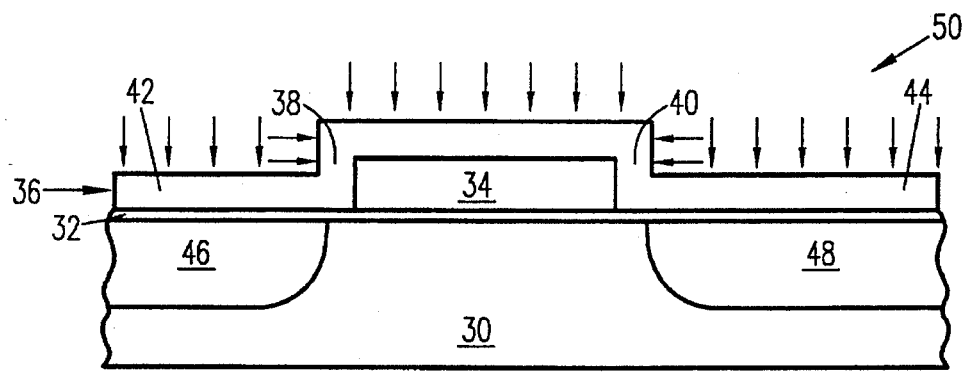

The ions pass through the relatively thin regions 42, 44 of the deposited oxide layer 36, through the thin oxide layer 32 and into the semiconductor body 30, meanwhile with the relatively thick portions 38, 40 of the deposited oxide layer 36 blocking ions from passing therethrough. Subsequently, heavily doped N+ regions 46, 48 are formed in the semiconductor body 30 by drivein of the implanted ions, these regions being self-aligned to the edges of the thick regions 38, 40 (FIG. 7).

Figure 8:
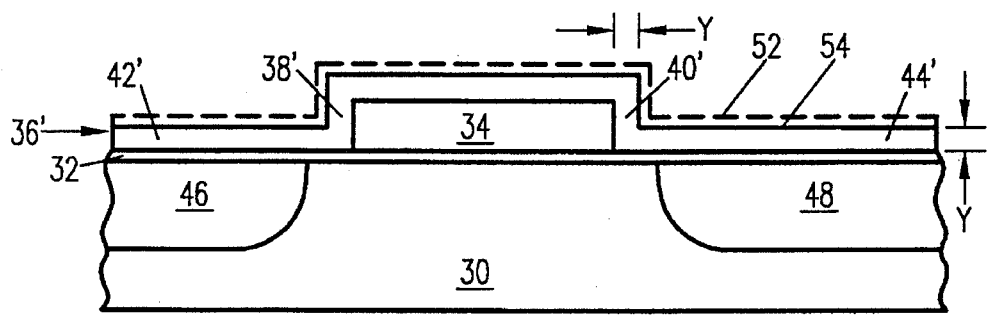
Figure 9:
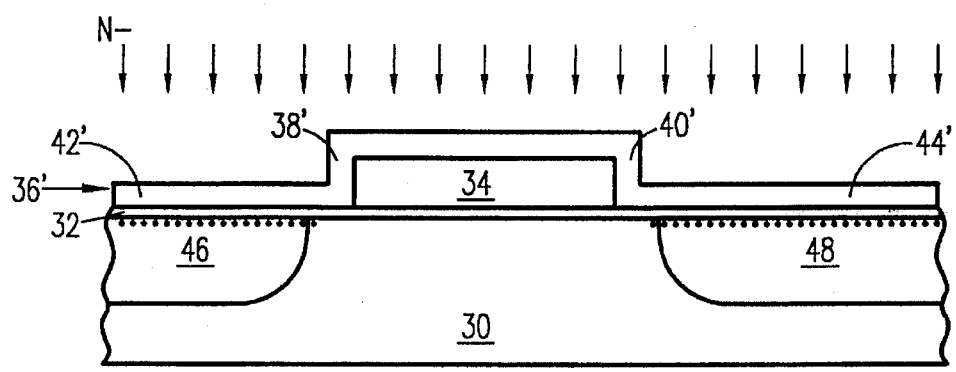

Next, an isotropic etch (which can be a dry plasma etch or a wet dip etch using BOE ($H_2O$: HF=50:1) solution is undertaken, as shown by the arrows 50 in FIG. 7, to remove a small portion of oxide layer 36 uniformally across the surface thereof. The layer 36 changes in form from that shown as a dotted line 52 to that shown as a solid line 54 (FIG. 8). As seen, the relatively thick regions 38, 40 have been reduced in width to a dimension Y by such etching, taking the form shown at 38', 40'.

Then, another ion implant step (shown as N–) is undertaken. Examples of the parameters thereof are given below.

|  |  | PLDD implant |  | NLDD implant | |
|---|---|---|---|---|---|
|  | ion dose | $BF_2$ $1-5 \times 10^{13}$ | or | boron $1-5 \times 10^{13}$ | phousphourus $1-5 \times 10^{13}$ |
| energy relative to remaining oxide layer thickness | 0 500 1000 1500 2000 | 020–50 Kev 50–80 Kev 80 Kev–120 Kev 120–150 Kev 150–200 Kev |  | — — 30–50 Kev 50–70 Kev 60–80 Kev | 20–60 Kev 60–120 Kev 120–180 Kev 180–700 Kev 300–400 Kev |

Figure 10:
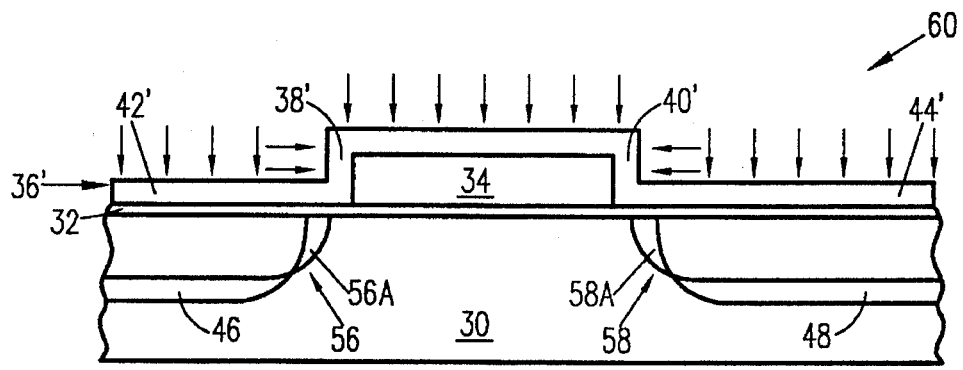
Figure 11:
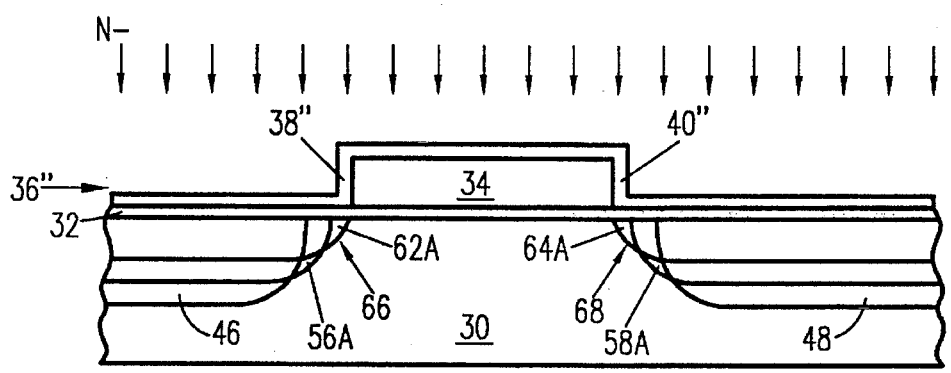

This implant step forms regions 56, 58 (FIG. 10) which, after drive in, are not as deep as the originally formed regions 46, 48, and define respective extended regions 56A, 58A which are aligned to the edge of the thick regions 38', 40' so as to be closer to the edge of the gate 34, and are more lightly doped then the originally formed regions 46, 48.

Then, another isotropic etching step similar to the above is undertaken as shown by the arrows 60 (FIG. 10), to again remove a substantially uniform layer from the deposited oxide layer 36'. This again results in thick oxide regions 38", 40" having a further reduced general width, so that upon another N– ion implant step being undertaken, at a lower dosage and lower energy that the previous implant, the lightly doped regions 62A, 64A are formed, extending from the lightly doped regions 56A, 58A.

This process can be repeated as necessary to form graded overall lightly doped regions 66, 68, with the doping becoming less as the lightly doped regions approach the gate 34, and with the depth of the lightly doped regions 66, 68 decreasing as the lightly doped regions 66, 68 approach the gate 34.

In this embodiment the regions formed by this method form the source and drain of a semiconductor device.

It will be seen that with this process, the lightly doped region profile can be optimized to enhance performance of the device and to minimize impact ionization and reduce series resistance thereof.

Meanwhile, it will readily be seen that the silicon body 30 is protected during the process of forming the lightly doped regions, because during the etching steps the silicon remains well protected by the deposited oxide layer 36. Thus, the problems of gouging the silicon during etching steps as described in regard to the prior art are completely avoided.

Figure 12:
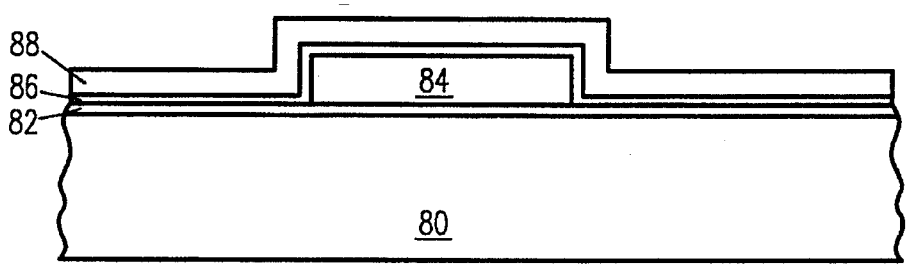
FIG. 12 shows a cross-sectional view of another embodiment of the invention.

FIG. 12 shows a view similar to that shown in FIG. 5, but of another embodiment of the invention. In this embodiment, a silicon body 80 has a gate oxide 82 grown thereover, and a gate 84 formed over the gate oxide, all as previously described. In this embodiment, however, a thin nitride layer 86 of approximately 200 Å thickness is deposited prior to the deposition of the oxide layer 88. This embodiment has the advantage that when the oxide layer 88 is completely removed by a continuous series of etching steps as described above, the silicon surface is still protected during the final etching step of the oxide layer 88. The nitride layer 86 may then remain in place or be removed by hot phosphoric acid, or etched as chosen.

We claim:

1. A method of fabricating a semiconductor device comprising:

providing a semiconductor body;

providing a first oxide layer on a surface of the semiconductor body;

forming a gate on the first oxide layer;

providing a second oxide layer over a portion of the first oxide layer from adjacent a side of the gate, the second oxide layer having a first region adjacent the side of the gate and a second region further spaced from the side of the gate, the first region being relatively thick and the second region being relatively thin, as measured from the surface of the semiconductor body, the first region having a general width as measured from the side of the gate;

implanting ions of a chosen conductivity type through the second region of the second oxide layer and through the first oxide layer thereunder and into the semiconductor body, the first region of the second oxide layer substantially blocking ions from reaching the semiconductor body;

removing a portion of the second oxide layer so as to reduce the general width of the first region from the side of the gate, meanwhile with a portion of the second region remaining;

implanting ions of a chosen conductivity type through the second region of the second oxide layer, the first region thereof substantially blocking ions from reaching the semiconductor body.

2. The method of claim 1 and further comprising the step of etching the second oxide layer to remove a portion thereof.

3. The method of claim 2 and further comprising the step of isotopically etching the second oxide layer to remove a portion thereof.

4. The method of claim 1 and further comprising the step of providing photoresist over a portion of the second oxide region prior to the first-mentioned implantation of ions.

5. The method of claim 1 and further comprising the step that the second-mentioned ion implantation is of a heavier dosage than the first-mentioned ion implantation.

6. The method of claim 1 and further comprising the step of providing that the second-mentioned ion implantation is undertaken at a higher implant energy then the first-mentioned ion implantation.

7. The method of claim 1 wherein the first-mentioned ions are the same species of the second-mentioned ions.

* * * * *